(12) United States Patent
Ma et al.

(10) Patent No.: US 12,200,861 B2
(45) Date of Patent: *Jan. 14, 2025

(54) CIRCUIT BOARD STRUCTURE

(71) Applicant: Unimicron Technology Corp., Taoyuan (TW)

(72) Inventors: Guang-Hwa Ma, Hsinchu (TW); Chin-Sheng Wang, Taoyuan (TW); Ra-Min Tain, Hsinchu County (TW)

(73) Assignee: Unimicron Technology Corp., Taoyuan (TW)

(*) Notice: Subject to any disclaimer, the term of this patent is extended or adjusted under 35 U.S.C. 154(b) by 196 days.

This patent is subject to a terminal disclaimer.

(21) Appl. No.: 17/979,754

(22) Filed: Nov. 2, 2022

(65) Prior Publication Data
US 2023/0046699 A1 Feb. 16, 2023

Related U.S. Application Data

(63) Continuation-in-part of application No. 17/674,837, filed on Feb. 18, 2022, now Pat. No. 11,690,173.
(Continued)

(30) Foreign Application Priority Data

Dec. 27, 2021 (TW) ................................. 110148855
Sep. 27, 2022 (TW) ................................. 111136488

(51) Int. Cl.
H05K 1/18       (2006.01)
H05K 1/11       (2006.01)
H05K 1/02       (2006.01)

(52) U.S. Cl.
CPC ............. *H05K 1/112* (2013.01); *H05K 1/181* (2013.01); *H05K 1/185* (2013.01); *H05K 1/021* (2013.01);
(Continued)

(58) Field of Classification Search
CPC ...... H05K 1/0298; H05K 1/023; H05K 1/181; H05K 1/185; H05K 1/032; H05K 1/036;
(Continued)

(56) References Cited

U.S. PATENT DOCUMENTS 7,554,131 B2   6/2009   Zeng
8,436,463 B2   5/2013   Hsu
(Continued)

FOREIGN PATENT DOCUMENTS

CN   209627793    11/2019
TW   201815240    4/2018

*Primary Examiner* — Steven T Sawyer
(74) *Attorney, Agent, or Firm* — JCIPRNET

(57) ABSTRACT

A circuit board structure includes a dielectric substrate, at least one embedded block, at least one electronic component, at least one first build-up circuit layer, at least one second build-up circuit layer, at least one conductive through hole, and a fine redistribution layer (RDL). The embedded block is fixed in a through cavity of the dielectric substrate. The electronic component is disposed in an opening of the embedded block. The first build-up circuit layer is disposed on a top surface of the dielectric substrate and electrically connected with the electronic component. The second build-up circuit layer is disposed on a bottom surface of the dielectric substrate and covers the embedded block. The conductive through hole is disposed in a via of the embedded block and electrically connects the first and the second build-up circuit layers. The fine RDL is disposed on and electrically connected to the first build-up circuit layer.

7 Claims, 2 Drawing Sheets

Related U.S. Application Data

(60) Provisional application No. 63/346,912, filed on May 30, 2022, provisional application No. 63/213,667, filed on Jun. 22, 2021.

(52) U.S. Cl.
CPC .............. *H05K 2201/0195* (2013.01); *H05K 2201/09472* (2013.01); *H05K 2201/10234* (2013.01); *H05K 2201/1031* (2013.01); *H05K 2201/10416* (2013.01)

(58) Field of Classification Search
CPC .................. H05K 1/092; H05K 1/113; H05K 2201/0323; H05K 1/021; H05K 2201/0347; H05K 1/144; H05K 1/111; H05K 1/112; H05K 1/182; H05K 1/183; H05K 1/184; H05K 3/4602; H05K 2201/045; H05K 2201/09036; H05K 2201/09745; H01L 23/5389; H01L 24/00; H01L 23/5383

See application file for complete search history.

(56) References Cited

U.S. PATENT DOCUMENTS

| | | | |
|---|---|---|---|
| 8,455,994 B2 | 6/2013 | Iihola | |
| 10,861,780 B1 * | 12/2020 | Huang | H01L 21/4857 |
| 2007/0074900 A1 * | 4/2007 | Lee | H01L 24/19 |
| | | | 257/E23.178 |
| 2010/0006330 A1 * | 1/2010 | Fu | H01L 24/19 |
| | | | 29/856 |
| 2011/0278713 A1 * | 11/2011 | Appelt | H01L 21/563 |
| | | | 257/E23.18 |
| 2016/0037629 A1 * | 2/2016 | Takahashi | H01L 24/17 |
| | | | 174/257 |
| 2018/0352658 A1 * | 12/2018 | Yang | H01L 24/25 |
| 2019/0380212 A1 * | 12/2019 | Chien | H05K 3/4623 |

* cited by examiner

CIRCUIT BOARD STRUCTURE

CROSS-REFERENCE TO RELATED APPLICATION

This application is a continuation-in-part application of and claims the priority benefit of U.S. application Ser. No. 17/674,837, filed on Feb. 18, 2022. The prior U.S. application Ser. No. 17/674,837 claims the priority benefits of U.S. provisional application Ser. No. 63/213,667, filed on Jun. 22, 2021, and Taiwan application serial no. 110148855, filed on Dec. 27, 2021. This application also claims the priority benefit of U.S. provisional application Ser. No. 63/346,912, filed on May 30, 2022, and Taiwan application serial no. 111136488, filed on Sep. 27, 2022. The entirety of each of the above-mentioned patent applications is hereby incorporated by reference herein and made a part of this specification.

BACKGROUND

Technical Field

The disclosure relates to a circuit board structure, and more particularly, to a circuit board structure including embedded blocks.

Description of Related Art

Nowadays, circuit boards with embedded electronic components are usually not effective in removing the heat generated by the electronic components, which leads to the problem of poor heat dissipation. Although replacing the core layer of the circuit board with a metal material may improve the above-mentioned problem of poor heat dissipation, the core layer will be too effective in heat dissipation, resulting in the problem of difficult assembly. For example, non-embedded electronic components or wafer packages are usually welded to the circuit board by solder balls, but circuit board with a metal core layer is not easily welded to the circuit board due to the excellent heat dissipation of the circuit board, resulting in the failure of solder balls to form and the failure to weld non-embedded electronic components or wafer packages to the circuit board.

SUMMARY

The disclosure provides a circuit board structure that may embed electronic components to increase module density and reduce signal loss.

The circuit board structure of the disclosure includes a dielectric substrate, at least one embedded block, at least one electronic component, at least one first build-up circuit layer, at least one second build-up circuit layer, at least one conductive through hole, and a fine redistribution layer (RDL). The dielectric substrate includes a top surface and a bottom surface opposite to each other and at least one through cavity penetrating the dielectric substrate and connecting the top surface and the bottom surface. The embedded block is fixed in the through cavity and includes an upper surface and a lower surface opposite to each other, at least one opening, and at least one via penetrating through the embedded block and connecting the upper surface and the lower surface. The electronic component is disposed in the opening of the embedded block. The first build-up circuit layer is disposed on the top surface of the dielectric substrate and covers the embedded block. The first build-up circuit layer is electrically connected with the electronic component. The second build-up circuit layer is disposed on the bottom surface of the dielectric substrate and covers the embedded block. The conductive through hole is disposed in the via of the embedded block and electrically connects the first build-up circuit layer and the second build-up circuit layer. The fine redistribution layer is disposed on the first build-up circuit layer and is electrically connected to the first build-up circuit layer.

In an embodiment of the disclosure, the first build-up circuit layer includes at least one connection pad, and the fine redistribution layer includes at least one connector. The connector is connected to the connection pad, so that the fine redistribution layer is electrically connected to the first build-up circuit layer. The connector includes at least one bump or at least one metal post.

In an embodiment of the disclosure, the circuit board structure further includes a first non-electroplating metal layer and a second non-electroplating metal layer. The first non-electroplating metal layer is disposed on the connection pad and covers the connection pad. The second non-electroplating metal layer is disposed on the connector and covers the connector. The first non-electroplating metal layer directly contacts the second non-electroplating metal layer. The first non-electroplating metal layer and the second non-electroplating metal layer are located between the connection pad and the connector.

In an embodiment of the disclosure, the circuit board structure further includes an underfill, disposed between the fine redistribution layer and the first build-up circuit layer and covering the first non-electroplating metal layer and the second non-electroplating metal layer.

In an embodiment of the disclosure, a minimum line width/line spacing of the fine redistribution layer is less than 1 micrometer.

In an embodiment of the disclosure, the fine redistribution layer includes multiple redistribution circuits, multiple conductive holes, multiple dielectric layers, and multiple pads. The redistribution circuits and the dielectric layers are alternately stacked and the conductive holes are electrically connected to adjacent two redistribution circuits. The pads are electrically connected to the redistribution circuits through the conductive holes. At least one layer of the dielectric layers is a photosensitive dielectric layer.

In an embodiment of the disclosure, the circuit board structure further includes a solder mask layer, disposed on the fine redistribution layer and exposing a part of the pads.

In an embodiment of the disclosure, the circuit board structure further includes a thermal interface material layer. The at least one opening of the embedded block is at least one blind hole. The thermal interface material layer is disposed in the blind hole and is located between the electronic component and a bottom of the blind hole.

In an embodiment of the disclosure, the circuit board structure further includes a dielectric material, filled in the via and the blind hole and covering the conductive through hole located in the via and the electronic component located in the blind hole.

In an embodiment of the disclosure, the circuit board structure further includes a dielectric material. The at least one opening of the embedded block is at least one through hole. The dielectric material is filled in the via and the through hole and covers the conductive through hole located in the via and the electronic component located in the through hole.

Based on the above, in the circuit board structure of the disclosure, the embedded block is fixed in a through cavity of the dielectric substrate. The electronic component is disposed in an opening of the embedded block. In other words, the electronic component is embedded in the dielectric substrate. The fine redistribution layer is disposed on the first build-up circuit layer and is electrically connected to the first build-up circuit layer. Therefore, the circuit board structure of the disclosure may be made smaller in size and thickness, and the module density may be improved. In addition, the conductive through hole is disposed in a via of the embedded block and electrically connects the first build-up circuit layer and the second build-up circuit layer, so that the signal of the conductive through hole may be protected from noise interference, thereby reducing the loss of the signal.

In order to make the above-mentioned features and advantages of the disclosure comprehensible, embodiments accompanied with drawings are described in detail below.

DESCRIPTION OF THE EMBODIMENTS

Figure 1:
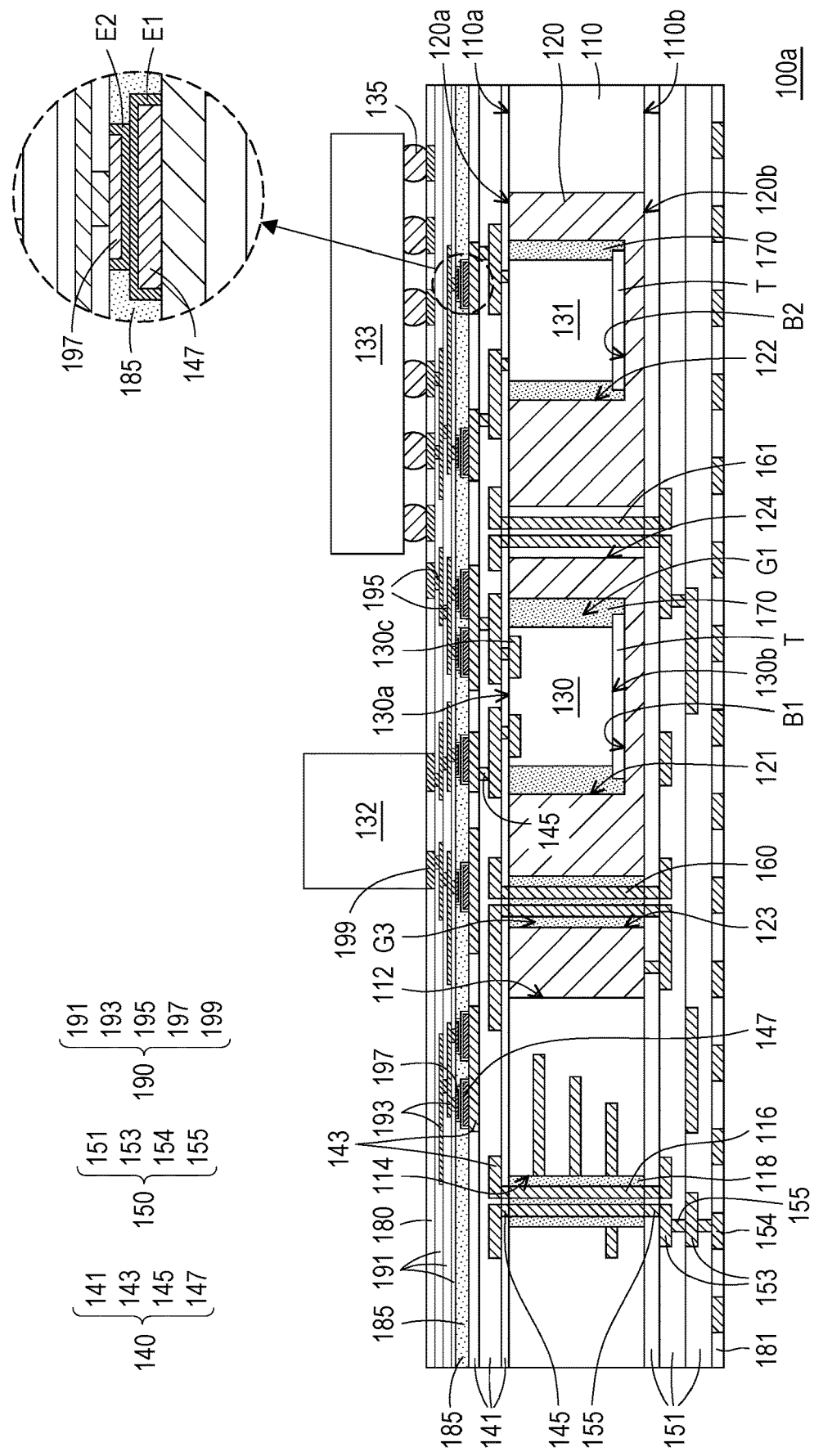
FIG. 1 is a cross-sectional schematic view of a circuit board structure according to an embodiment of the disclosure.

FIG. 1 is a cross-sectional schematic view of a circuit board structure according to an embodiment of the disclosure. Referring to FIG. 1, in this embodiment, the circuit board structure 100a includes a dielectric substrate 110, at least one embedded block 120, at least one electronic component 130, at least one electronic component 131, at least one first build-up circuit layer 140, at least one second build-up circuit layer 150, at least one conductive through hole 160, at least one conductive through hole 161, and a fine redistribution layer 190. The dielectric substrate 110 includes a top surface 110a and a bottom surface 110b opposite to each other and at least one through cavity 112 penetrating the dielectric substrate 110 and connecting the top surface 110a and the bottom surface 110b. The embedded block 120 is located in a through cavity 112 and includes a upper surface 120a and a lower surface 120b opposite to each other, at least one opening 121, at least one opening 122, and at least one via 123 and 124 penetrate through the embedded block 120 and connects the upper surface 120a and the lower surface 120b. The electronic component 130 and the electronic component 131 are disposed in the opening 121 and the opening 122 of the embedded block 120. The first build-up circuit layer 140 is disposed on a top surface 110a of the dielectric substrate 110 and covers the embedded block 120. The first build-up circuit layer 140 is electrically connected with the electronic component 130 and the electronic component 131. The second build-up circuit layer 150 is disposed on a bottom surface 110b of the dielectric substrate 110 and covers the embedded block 120. The conductive through hole 160 and the conductive through hole 161 are disposed in the via 123 and via 124 of the embedded block 120 and electrically connects the first build-up circuit layer 140 and the second build-up circuit layer 150. The fine redistribution layer 190 is disposed on the first build-up circuit layer 140 and is electrically connected to the first build-up circuit layer 140.

In detail, in this embodiment, the dielectric substrate 110 further includes a through hole 114, a conductive through hole 116, and a dielectric material layer 118. The through cavity 112 and the through hole 114 penetrate through the dielectric substrate 110 respectively. The aperture of the through cavity 112 is greater than that of the through hole 114. The through cavity 112 and the through hole 114 may connect the top surface 110a and the bottom surface 110b of the dielectric substrate 110. Conductive through hole 116 may be disposed in the through hole 114. The dielectric material layer 118 may be disposed in the through hole 114 to fill a gap between the conductive through hole 116 and the dielectric substrate 110. In an embodiment, the material of the dielectric substrate 110 may include epoxy glass cloth with flame retardant and self-extinguishing properties (FR-4) or BT resin (bismaleimide triazine resin), but not limited thereto.

The embedded block 120 is fixed in the through cavity 112. The upper surface 120a of the embedded block 120 may be substantially flush with the top surface 110a of the dielectric substrate 110. The lower surface 120b of the embedded block 120 may be substantially flush with the bottom surface 110b of the dielectric substrate 110, but not limited thereto. In an embodiment, the embedded block 120 may be made of conductive material, so that the heat generated by the electronic component 130 and electronic component 131 may be transferred through the embedded block 120, thereby improving the overall heat-dissipation effect. The conductive material may include metal (e.g., copper), alloy, or metal mixed with non-metal material. In an embodiment, the embedded block 120 may be made of non-metal material, such as diamond or graphene, but not limited thereto. In an embodiment, the embedded block 120 may be made of a non-conductive material. The non-conductive material may include glass, ceramic, or other organic materials, but not limited thereto.

The electronic component 130 and the electronic component 131 are disposed in the opening 121 and the opening 122 of the embedded block 120. The opening 121 and the opening 122 of the embedded block 120 are embodied as blind holes with bottom B1 and bottom B2. That is, the opening 121 and the opening 122 do not penetrate the embedded block 120. A gap G1 is provided between the electronic component 130, the electronic component 131, and the embedded block 120. The electronic component 130 and electronic component 131 may be active elements and/or passive elements. The active element may be, for example, a bare die or a package module. The passive element may be, for example, a capacitor, an inductor, or a resistor, but not limited thereto. In an embodiment, the electronic component 130 is, for example, an active element and is disposed in the opening 121. The electronic component 131 is, for example, a passive element and is disposed in the opening 122. The electronic component 130 includes an active surface 130a, a back surface 130b opposite to the active surface 130a, and a pad 130c disposed on the active surface 130a. The active surface 130a may be substantially flush with the upper surface 120a of the embedded block 120, but not limited thereto.

In this embodiment, the circuit board structure 100a may further include a thermal interface material layer T. The thermal interface material layer T is disposed in the opening 121 and the opening 122 (i.e., blind holes) and is located between the electronic components 130, the electronic component 131, the bottom B1, and the bottom B2 of the opening 121 and the opening 122 (i.e., blind holes). The thermal interface material layer T may fill the gaps between the electronic component 130, the electronic component 131, the bottom B1, and the bottom B2 of the opening 121 and the opening 122 (i.e., blind holes) to improve the heat transfer efficiency and reduce the interface thermal resistance. The thermal interface material layer T is, for example, a thermally conductive glue, thermally conductive paste, thermally conductive film, or thermally conductive tape including a conductive material (e.g., conductive particles), but not limited thereto.

The first build-up circuit layer 140 may include at least one dielectric layer 141, at least one circuit layer 143, at least one via hole 145, and at least one connection pad 147. The dielectric layer 141 and the circuit layer 143 are sequentially stacked on the top surface 110a of the dielectric substrate 110 and on the embedded block 120. The connection pad 147 is disposed on the dielectric layer 141 away from the dielectric substrate 110. The via hole 145 penetrates through the dielectric layer 141, electrically connecting the circuit layer 143 of two adjacent layers, electrically connecting the circuit layer 143 and the conductive through hole 116, electrically connecting the circuit layer 143 and the conductive through hole 160 and the conductive through hole 161, and electrically connecting the circuit layer 143 and the electronic component 130 and the electronic component 131. Although the dielectric layer 141 in the first build-up circuit layer 140 is a three-layer example and the circuit layer 143 is a two-layer example, the disclosure does not limit the number of layers of the dielectric layer 141 and the circuit layer 143. That is to say, in an embodiment, the number of layers of the dielectric layer 141 may also be one, two or more than four layers. The number of layers of the circuit layer 143 may also be one or more than three layers.

The second build-up circuit layer 150 may include at least one dielectric layer 151, at least one circuit layer 153, at least one external pad 154, and at least one via hole 155. The dielectric layer 151 and the circuit layer 153 are sequentially stacked on the bottom surface 110b of the dielectric substrate 110 and on the embedded block 120. The external pad 154 is disposed on the dielectric layer 151 away from the dielectric substrate 110. The via hole 155 penetrates through the dielectric layer 151, electrically connecting the circuit layer 153 of two adjacent layers, electrically connecting the external pad 154 and the circuit layer 153, electrically connecting the circuit layer 153 and the conductive through hole 116, and electrically connecting the circuit layer 153 and the conductive through hole 160 and the conductive through hole 161. Although the dielectric layer 151 in the second build-up circuit layer 150 is a three-layer example and the circuit layer 153 is a two-layer example, the disclosure does not limit the number of layers of the dielectric layer 151 and the circuit layer 153. That is to say, in an embodiment, the number of layers of the dielectric layer 151 may also be one, two or more than four layers. The number of layers of the circuit layer 153 may also be one or more than three layers.

The conductive through hole 160 and the conductive through hole 161 may be respectively disposed in the via 123 and the via 124 of the embedded block 120. A gap G3 is provided between the conductive through hole 160, the conductive through hole 161, and the embedded block 120. The conductive through hole 160 and the conductive through hole 161 may contact the via hole 145 and the via hole 155, so that the conductive through hole 160 and the conductive through hole 161 may be electrically connected to the first build-up circuit layer 140 and the second build-up circuit layer 150. In an embodiment, the conductive through hole 160 and the conductive through hole 161 may be surrounded by the embedded block 120 including conductive material, so that the signals of the conductive through hole 160 and the conductive through hole 161 may be protected from being disturbed by noise, thereby reducing the loss of the signal and improving the signal integrity. The material of the conductive through hole 160 and the conductive through hole 161 is, for example, copper, but not limited thereto.

In this embodiment, the dielectric material 170 may be filled in the via 123, the via 124, the opening 121, and the opening 122 (i.e., blind holes) and cover the conductive through hole 160 and conductive through hole 161 located in the via 123 and the via 124, and the electronic component 130 and the electronic component 131 in the opening 121 and the opening 122 (i.e., blind holes). The dielectric material 170 may be disposed in the gap G1 between the electronic component 130, the electronic component 131, and the embedded block 120, as well as the gap G3 between the conductive through hole 160, the conductive through hole 161, and the embedded block 120. If the embedded block 120 includes conductive material, the disposition of the dielectric material 170 may avoid short circuit between the conductive through hole 160, the conductive through hole 161, and the embedded block 120. The dielectric material may include prepreg or gel, but not limited thereto. In an embodiment, the conductive through hole 160, the conductive through hole 161, the embedded block 120 including conductive material, and the dielectric material 170 may form a coaxial via.

Referring to FIG. 1 again, the fine redistribution layer 190 of this embodiment includes multiple dielectric layers 191, multiple redistribution circuits 193, multiple conductive holes 195, at least one connector 197, and multiple pads 199. The redistribution circuits 193 and the dielectric layers 191 are alternately stacked, and the conductive holes 195 are electrically connected to adjacent two redistribution circuits 193. The connector 197 may be connected to the connection pad 147, so that the fine redistribution layer 190 is electrically connected to the first build-up circuit layer 140. The connector 197 may be, for example, at least one bump or at least one metal post. The pads 199 are electrically connected to the redistribution circuits 193 through the conductive holes 195. At least one layer of the dielectric layers 191 is a photosensitive dielectric layer. That is, the three-layer dielectric layer 191 in FIG. 1 may all be photosensitive dielectric layers, or some may be photosensitive dielectric layers, and the rest may be non-photosensitive dielectric layers. In an embodiment, a line width/line spacing of the fine redistribution layer 190 may be, for example, less than 8 micrometers. In an embodiment, a minimum line width/line spacing of the fine redistribution layer 190 may be less than 1 micrometer.

In an embodiment, the circuit board structure 100a further includes a first non-electroplating metal layer E1 and a second non-electroplating metal layer E2. The first non-electroplating metal layer E1 is disposed on the connection pad 147 and covering the connection pad 147. The second non-electroplating metal layer E2 is disposed on the connector 197 and covering the connector 197. The first non-electroplating metal layer E1 directly contacts the second non-electroplating metal layer E2. The first non-electroplating metal layer E1 and the second non-electroplating metal layer E2 are located between the connection pad 147 and the connector 197, which may improve the bonding force between the fine redistribution layer 190 and the first build-up circuit layer 140. The first non-electroplating metal layer E1 and the second non-electroplating metal layer E2 may be, for example, non-electroplating copper layer or non-electroplating alloy, but not limited thereto.

In addition, the circuit board structure 100a further includes an underfill 185, disposed between the fine redistribution layer 190 and the first build-up circuit layer 140 and covering the first non-electroplating metal layer E1 and the second non-electroplating metal layer E2 for protecting the connection pad 147, the connector 197, the first non-electroplating metal layer E1, and the second non-electroplating metal layer E2. In addition, the circuit board structure 100a may further include a solder mask layer 180, a solder mask layer 181, an electronic component 132, and an electronic component 133. The solder mask layer 180 is disposed on the fine redistribution layer 190 and exposing a part of the pads 199. The solder mask layer 181 is disposed on the second build-up circuit layer 150, covering the dielectric layer 151 and exposing the external pad 154. The electronic component 132 and the electronic component 133 may be disposed respectively on the fine redistribution layer 190. The electronic component 132 may directly contact and electrically connect the pads 199 exposed by the solder mask layer 180. The electronic component 133 may be electrically connected to the pads 199 exposed by the solder mask layer 180 through a conductive terminal 135.

By embedding the electronic component 130 and the electronic component 131 in the dielectric substrate 110, and disposing and electrically connecting the fine redistribution layer 190 to the first build-up circuit layer 140, the module density of the circuit board structure 100a may be improved and the overall size (e.g., volume, area) of the circuit board structure 100a may be reduced. In addition, compared to electronic components that are disposed horizontally and transmit signals horizontally, the embedded electronic component 130 and electronic component 131 may perform signal transmission with the non-embedded electronic component 132 and electronic component 133 in a vertical manner so as to shorten the distance of signal transmission and improve the electrical effect. Furthermore, if the embedded block 120 is made of conductive material, the heat generated by the embedded electronic component 130 and electronic component 131 may be transferred through the embedded block 120, thereby improving the overall heat-dissipation effect. Besides, by disposing the conductive through hole 160 and the conductive through hole 161 in the via 123 and the via 124 of the embedded block 120, the conductive through hole 160 and the conductive through hole 161 may be surrounded by the embedded block 120 including conductive material, so that the signals of the conductive through hole 160 and the conductive through hole 161 may be protected from being disturbed by noise, thereby reducing the loss of the signal and improving the signal integrity.

Other embodiments are described below for illustrative purposes. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2:
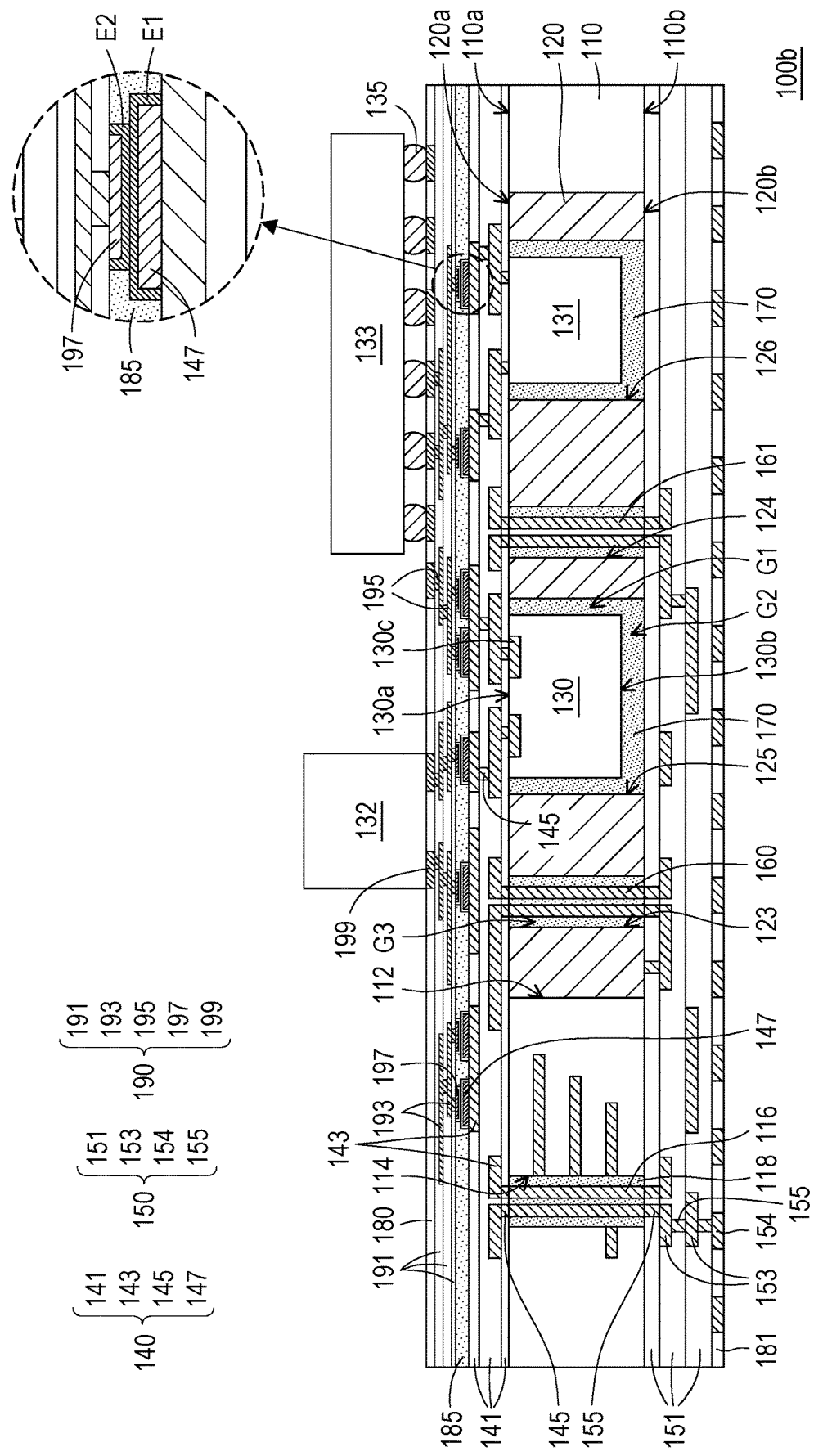
FIG. 2 is a cross-sectional schematic view of a circuit board structure according to an embodiment of the disclosure.

FIG. 2 is a cross-sectional schematic view of a circuit board structure according to an embodiment of the disclosure. With reference to both FIG. 1 and FIG. 2, the circuit board structure 100b of this embodiment is similar to the circuit board structure 100a of FIG. 1, and the main difference between the two is that in this embodiment, the at least one opening 125 and opening 126 of the embedded block 120 are embodied as at least one through hole. That is, the opening 125 and the opening 126 penetrate the embedded block 120. The dielectric material 170 may be filled in the via 123, the via 124, the opening 125, and the opening 126 (i.e., through holes) and cover the conductive through hole 160 and conductive through hole 161 located in the via 123 and the via 124, and the electronic component 130 and the electronic component 131 in the opening 125 and the opening 126 (i.e., through holes).

To sum up, in the circuit board structure of the disclosure, the embedded block is fixed in a through cavity of the dielectric substrate. The electronic component is disposed in an opening of the embedded block. In other words, the electronic component is embedded in the dielectric substrate. The fine redistribution layer is disposed on the first build-up circuit layer and is electrically connected to the first build-up circuit layer. Therefore, the circuit board structure of the disclosure may be made smaller in size and thickness, and the module density may be improved. In addition, the conductive through hole is disposed in a via of the embedded block and electrically connects the first build-up circuit layer and the second build-up circuit layer, so that the signal of the conductive through hole may be protected from noise interference, thereby reducing the loss of the signal or improving the integrity of the signal.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:
1. A circuit board structure, comprising:
 a dielectric substrate, comprising a top surface and a bottom surface opposite to each other and at least one through cavity penetrating the dielectric substrate and connecting the top surface and the bottom surface;
 at least one embedded block, fixed in the at least one through cavity, wherein the at least one embedded block comprises an upper surface and a lower surface opposite to each other, at least one opening, and at least one via penetrating through the at least one embedded block and connecting the upper surface and the lower surface;
 at least one electronic component, disposed in the at least one opening of the at least one embedded block;
 at least one first build-up circuit layer, disposed on the top surface of the dielectric substrate and covering the at least one embedded block, wherein the at least one first build-up circuit layer is electrically connected with the at least one electronic component;
 at least one second build-up circuit layer, disposed on the bottom surface of the dielectric substrate and covering the at least one embedded block;
 at least one conductive through hole, disposed in the at least one via of the at least one embedded block and electrically connecting the at least one first build-up circuit layer and the at least one second build-up circuit layer;
 a fine redistribution layer, disposed on the at least one first build-up circuit layer and electrically connected to the at least one first build-up circuit layer;
 a thermal interface material layer, wherein the at least one opening of the at least one embedded block is at least one blind hole, the thermal interface material layer is disposed in the at least one blind hole and is located between the at least one electronic component and a bottom of the at least one blind hole; and a dielectric material, filled in the at least one via and the at least one blind hole and covering the at least one conductive through hole located in the at least one via and the at least one electronic component located in the at least one blind hole.

2. The circuit board structure according to claim 1, wherein the at least one first build-up circuit layer comprises at least one connection pad, the fine redistribution layer comprises at least one connector, the at least one connector is connected to the at least one connection pad, so that the fine redistribution layer is electrically connected to the at least one first build-up circuit layer, and the at least one connector comprises at least one bump or at least one metal post.

3. The circuit board structure according to claim 2, further comprising:
a first non-electroplating metal layer, disposed on the at least one connection pad and covering the at least one connection pad; and
a second non-electroplating metal layer, disposed on the at least one connector and covering the at least one connector, wherein the first non-electroplating metal layer directly contacts the second non-electroplating metal layer, and the first non-electroplating metal layer and the second non-electroplating metal layer are located between the at least one connection pad and the at least one connector.

4. The circuit board structure according to claim 3, further comprising:
an underfill, disposed between the fine redistribution layer and the at least one first build-up circuit layer and covering the first non-electroplating metal layer and the second non-electroplating metal layer.

5. The circuit board structure according to claim 1, wherein a minimum line width/line spacing of the fine redistribution layer is less than 1 micrometer.

6. The circuit board structure according to claim 1, wherein the fine redistribution layer comprises a plurality of redistribution circuits, a plurality of conductive holes, a plurality of dielectric layers, and a plurality of pads, and the redistribution circuits and the dielectric layers are alternately stacked, the conductive holes are electrically connected to adjacent two redistribution circuits, the pads are electrically connected to the redistribution circuits through the conductive holes, and at least one layer of the dielectric layers is a photosensitive dielectric layer.

7. The circuit board structure according to claim 6, further comprising:
a solder mask layer, disposed on the fine redistribution layer and exposing a part of the pads.

* * * * *